(12) United States Patent
Wong et al.

(10) Patent No.: US 11,189,705 B2
(45) Date of Patent: Nov. 30, 2021

(54) METHODS OF REDUCING PARASITIC CAPACITANCE IN MULTI-GATE FIELD-EFFECT TRANSISTORS

(71) Applicant: Taiwan Semiconductor Manufacturing Co., Ltd., Hsin-Chu (TW)

(72) Inventors: I-Hsieh Wong, Hsinchu (TW); Wei-Yang Lee, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/850,733

(22) Filed: Apr. 16, 2020

(65) Prior Publication Data
US 2021/0036122 A1    Feb. 4, 2021

Related U.S. Application Data

(60) Provisional application No. 62/880,274, filed on Jul. 30, 2019.

(51) Int. Cl.
| | |
|---|---|
| *H01L 29/49* | (2006.01) |
| *H01L 29/06* | (2006.01) |
| *H01L 29/417* | (2006.01) |
| *H01L 29/423* | (2006.01) |
| *H01L 29/786* | (2006.01) |

(Continued)

(52) U.S. Cl.
CPC .... *H01L 29/4908* (2013.01); *H01L 21/02603* (2013.01); *H01L 21/28141* (2013.01); *H01L 21/764* (2013.01); *H01L 29/0673* (2013.01); *H01L 29/41733* (2013.01); *H01L 29/42392* (2013.01); *H01L 29/4991* (2013.01); *H01L 29/66545* (2013.01); *H01L 29/66553* (2013.01); *H01L 29/66742* (2013.01); *H01L 29/78618* (2013.01); *H01L 29/78696* (2013.01)

(58) Field of Classification Search
CPC ............. H01L 29/4908; H01L 29/0673; H01L 29/41733; H01L 29/42392; H01L 29/4991; H01L 29/66545; H01L 29/66553; H01L 29/66742; H01L 29/78618; H01L 29/78696; H01L 21/02603; H01L 21/28141; H01L 21/764
USPC ....................................................... 257/347
See application file for complete search history.

(56) References Cited

U.S. PATENT DOCUMENTS

| | | | | |
|---|---|---|---|---|
| 10,910,470 B1 * | 2/2021 | Wu | .................... | H01L 29/66545 |
| 2008/0254579 A1 * | 10/2008 | Chi | .................... | H01L 29/6653 |
| | | | | 438/199 |

(Continued)

*Primary Examiner* — Tong-Ho Kim
(74) *Attorney, Agent, or Firm* — Haynes and Boone, LLP

(57) ABSTRACT

A semiconductor structure includes a stack of semiconductor layers disposed over a substrate, a first metal gate stack disposed over the stack of semiconductor layers, a second metal gate stack interleaved between the stack of semiconductor layers, a source/drain (S/D) feature disposed in the stack of semiconductor layers, and an S/D contact disposed over the S/D feature. In many examples, the S/D feature is separated from a sidewall of the second metal gate stack by a first air gap and the S/D contact is separated from a sidewall of the first metal gate stack by a second air gap.

20 Claims, 15 Drawing Sheets

(51) Int. Cl.
*H01L 21/02* (2006.01)
*H01L 21/28* (2006.01)
*H01L 21/764* (2006.01)
*H01L 29/66* (2006.01)

(56) References Cited

U.S. PATENT DOCUMENTS

2019/0157414 A1* 5/2019 Ando ................ H01L 29/78696
2020/0020567 A1* 1/2020 Sun ................... H01L 21/31053

* cited by examiner

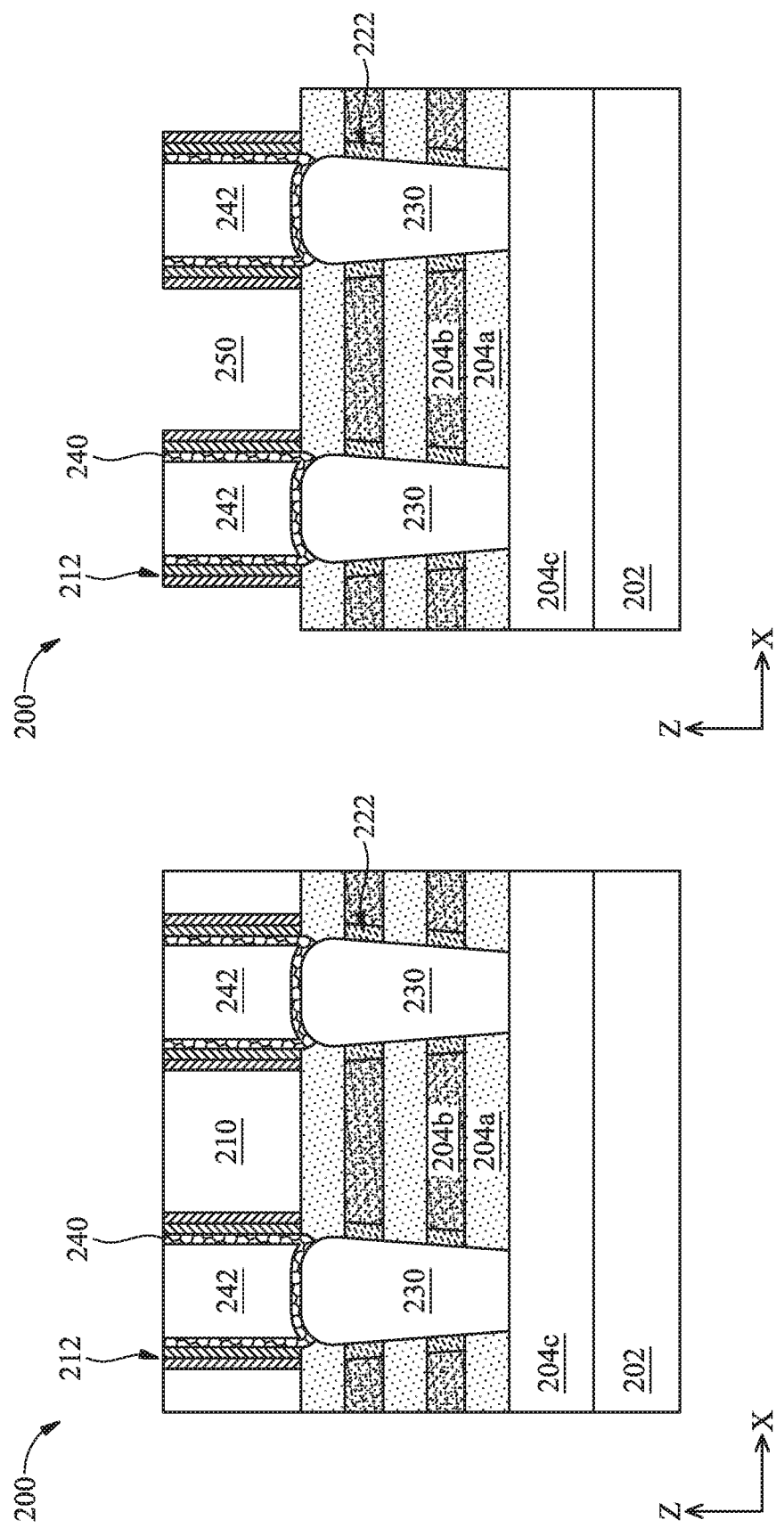

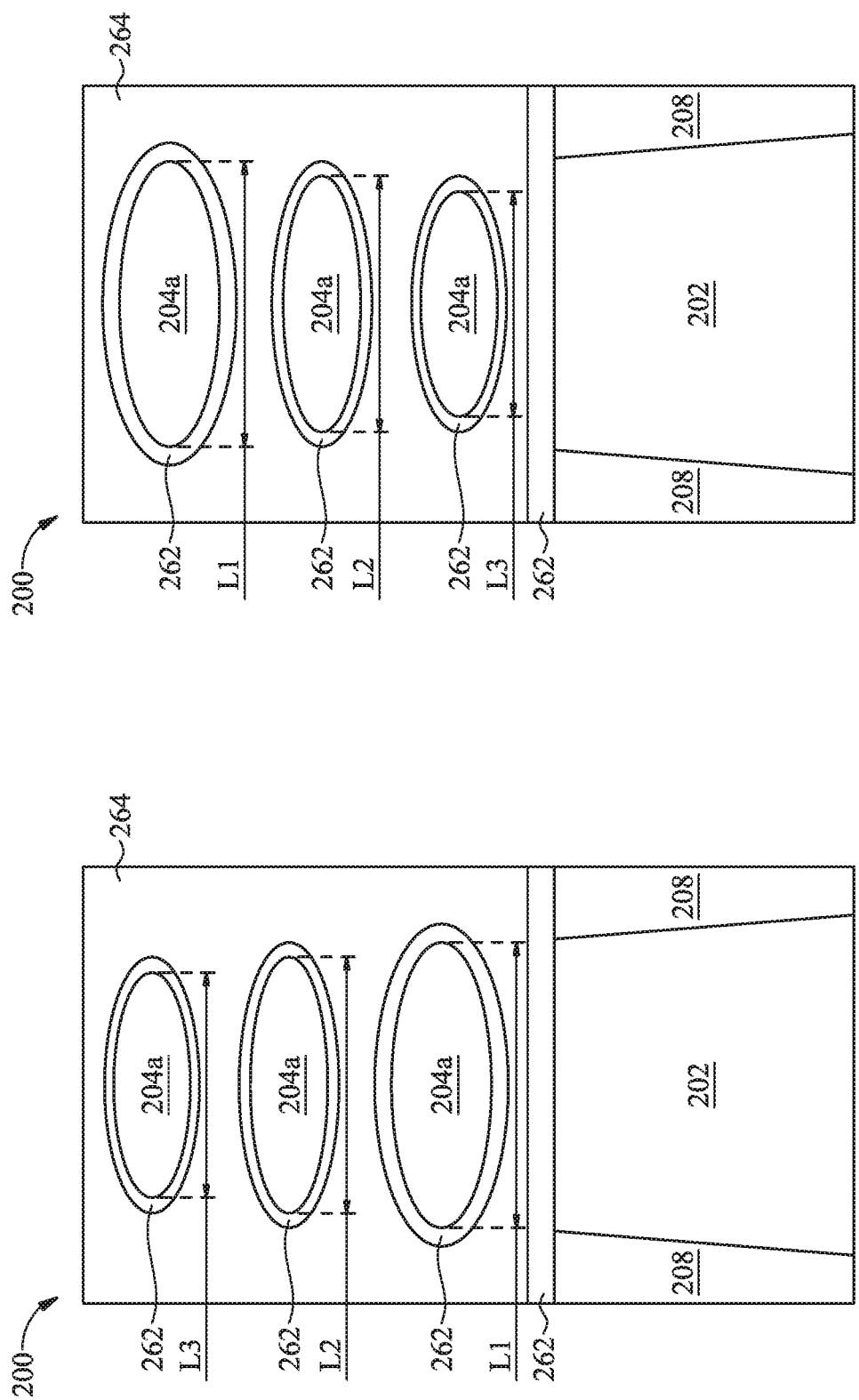

METHODS OF REDUCING PARASITIC CAPACITANCE IN MULTI-GATE FIELD-EFFECT TRANSISTORS

CROSS-REFERENCE TO RELATED APPLICATIONS

This is a non-provisional application of and claims priority to U.S. Provisional Patent Application Ser. No. 62/880,274, filed on Jul. 30, 2019, the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) transistors, have been incorporated into various memory and core devices to reduce IC chip footprint while maintaining reasonable processing margins. As with other semiconductor devices, scaling down has indeed increased the complexity of manufacturing GAA transistors and, in order for their advances to be realized, improvements in various aspects of their fabrication processes are needed. In one such example, providing inner spacers with sufficient etching resistance without increasing the overall parasitic capacitance of a GAA transistor becomes more challenging when device sizes continue to decrease. Although existing methods of fabricating inner spacers have been generally adequate, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, 12, 13, 16, 17, 18A, 18B, 18C, and 18D are cross-sectional views of the semiconductor device along dashed line AA' as shown in FIGS. 2A and 2B during intermediate stages of the method shown in FIG. 1, according to various embodiments of the present disclosure.

FIGS. 19A, 19B, and 20 are cross-sectional views of the semiconductor device along dashed line BB' as shown in FIGS. 2A and 2B during intermediate stages of the method shown in FIG. 1, according to various embodiments of the present disclosure.

DETAILED DESCRIPTION

Figure 1:
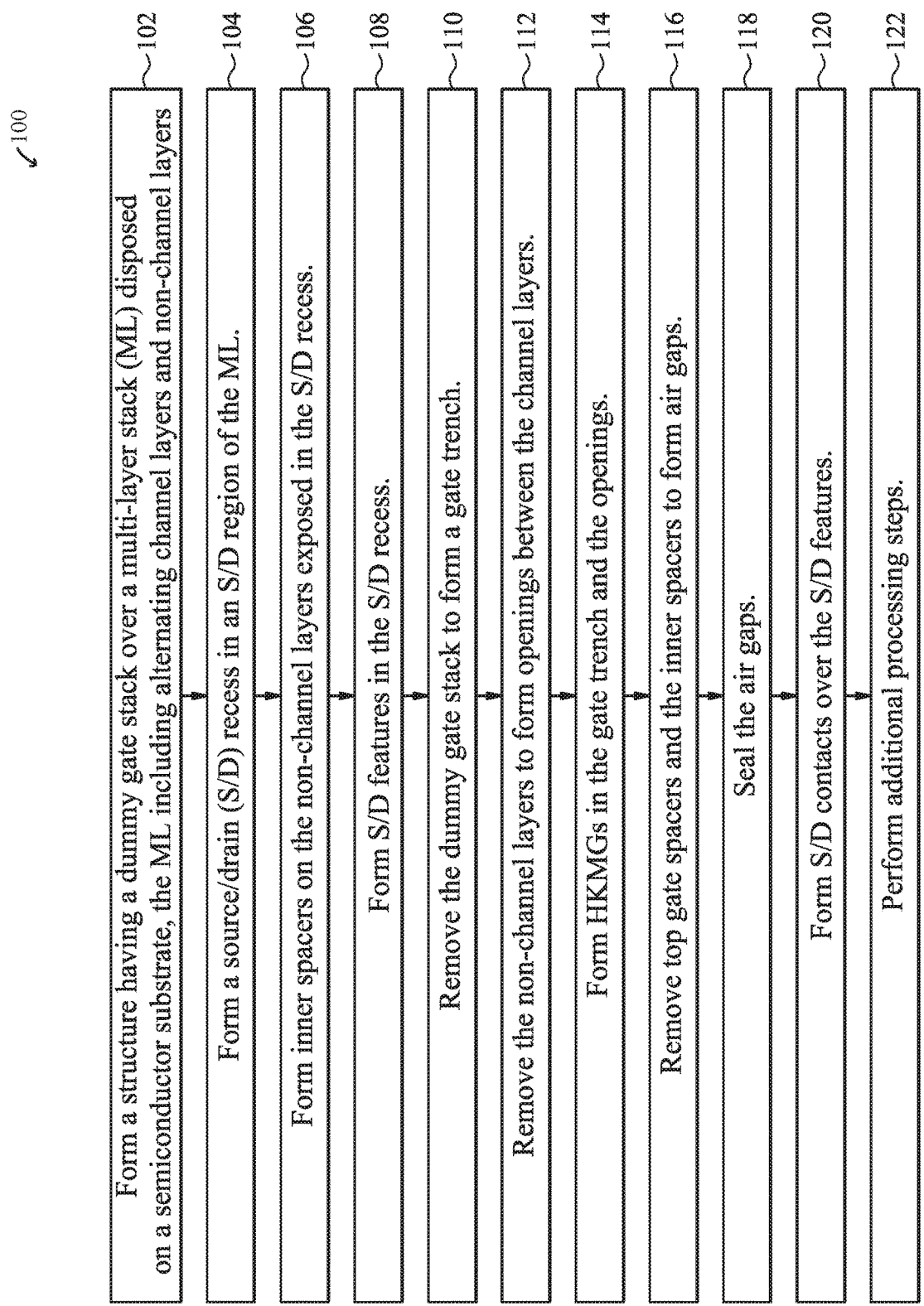
FIG. 1 illustrates a flowchart of an example method for fabricating a semiconductor device, according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/− 10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional gate-all-around (GAA) FETs, fin FETs (FinFETs), and/or other FETs. Generally, a GAA FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. While existing technologies for fabricating GAA FETs have been generally adequate for their intended applications, they have not been entirely satisfactory in all aspects. The present disclosure includes multiple embodiments. Different embodiments may have different advantages, and no particular advantage is necessarily required of any embodiment.

Figures 2A, 2B:
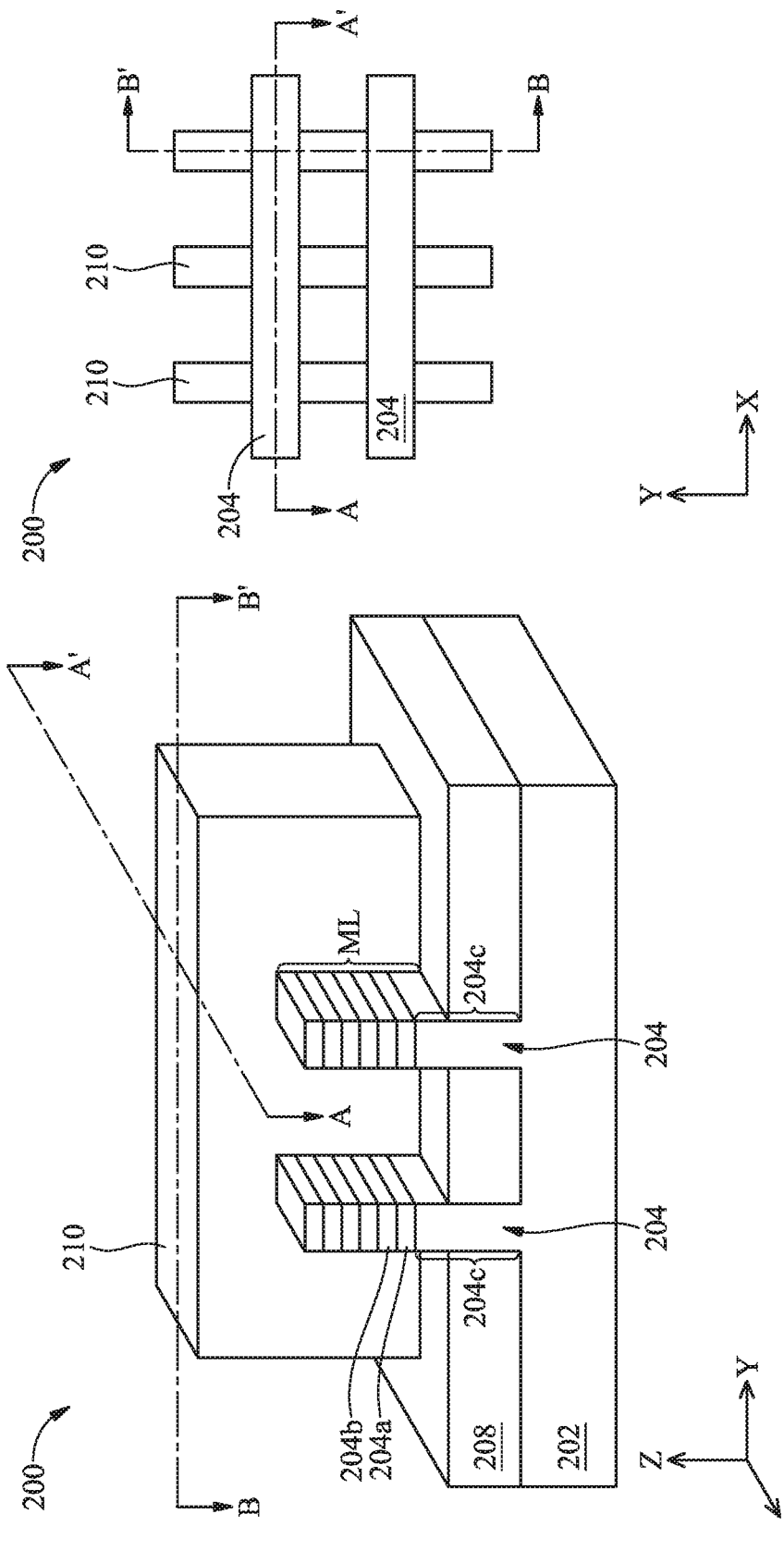
FIGS. 2A and 14 are three-dimensional perspective views of an example semiconductor device, according to various embodiments of the present disclosure.
FIGS. 2B, 15A, and 15B are planar top views of the semiconductor device shown in FIG. 2A, according to various embodiments of the present disclosure.

Referring now to FIG. 1, a flowchart of a method 100 of forming a semiconductor device 200 (hereafter simply referred to as the device 200) is illustrated according to various aspects of the present disclosure. Method 100 is merely an example and is not intended to limit the present disclosure beyond what is explicitly recited in the claims. Additional operations can be provided before, during, and after method 100, and some operations described can be replaced, eliminated, or moved around for additional embodiments of the method. Method 100 is described below in conjunction with FIGS. 2A-18D; of which, FIGS. 2A and 14 are three-dimensional perspective views of the device

Figure 15B:
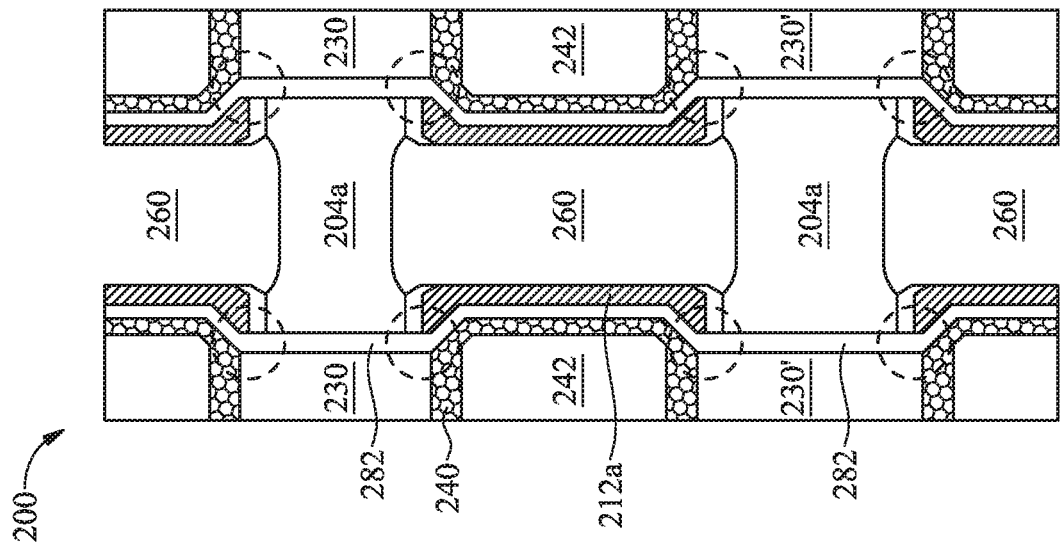
Figure 15A:
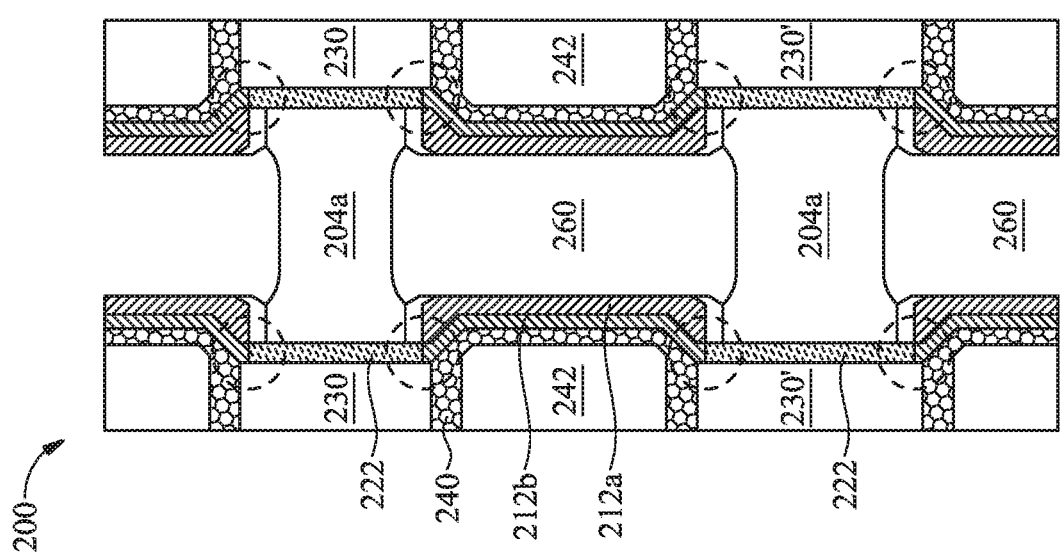
Figure 20:
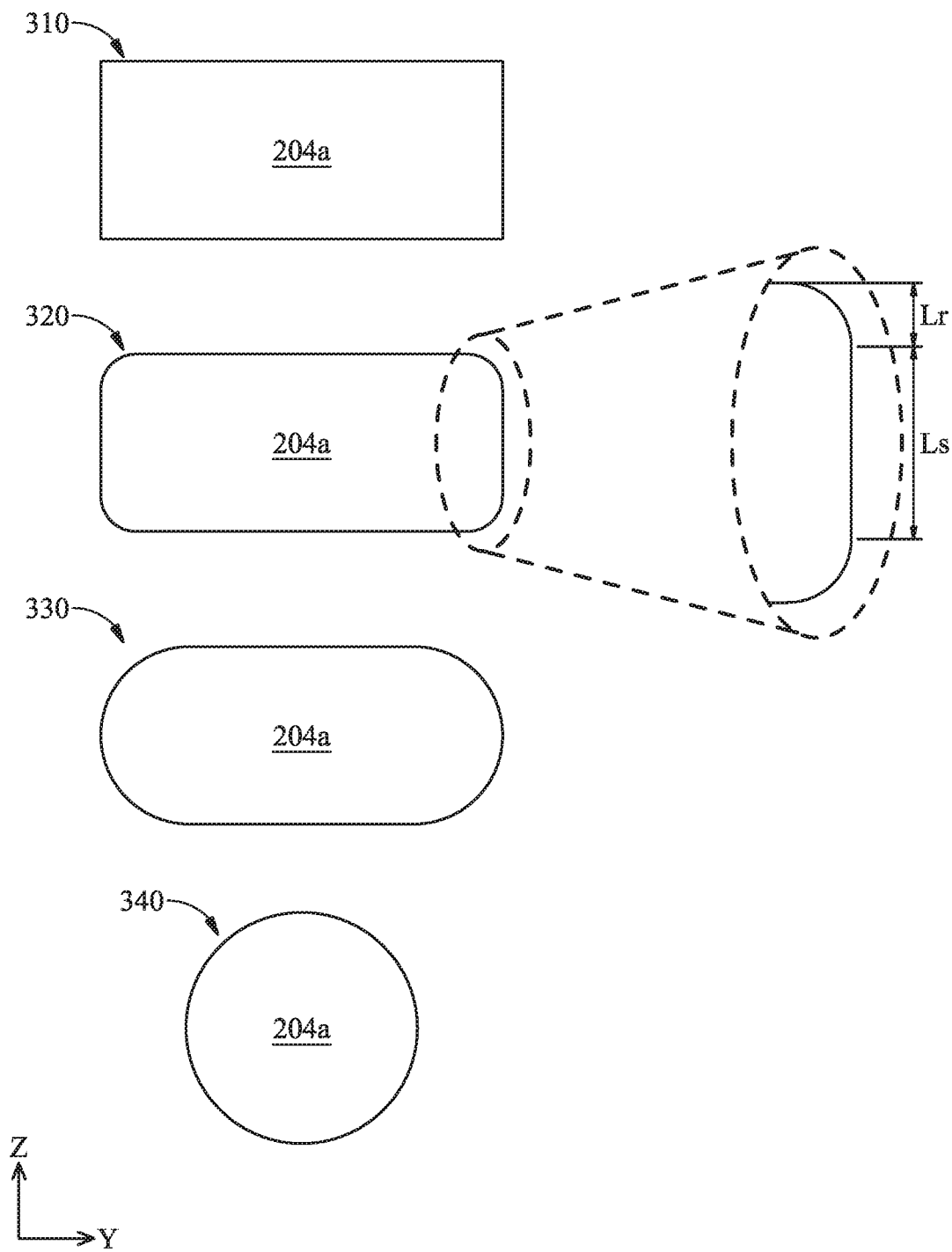

200; FIGS. 2B, 15A, and 15B are planar top views of the device 200 as shown in FIG. 2A; FIGS. 3, 4, 5, 6, 7, 8, 9, 10, 11, 12, 13, 16, 17, 18A, 18B, 18C, and 18D are cross-sectional views of the device 200 taken along the dotted line AA' (i.e., in the XZ plane) as shown in FIGS. 2A and/or 2B; FIGS. 19A, 19B, and 20 are cross-sectional views of the device 200 taken along the dotted line BB' (i.e., in the XY plane) as shown in FIGS. 2A and 2B at intermediate steps of method 100.

The device 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. The present disclosure is not limited to any particular number of devices or device regions, or to any particular device configurations. For example, though the device 200 as illustrated is a three-dimensional device, the present disclosure may also provide embodiments for fabricating planar devices. Additional features can be added to the device 200, and some of the features described below can be replaced, modified, or eliminated in other embodiments of the device 200.

Referring to FIGS. 2A-4, method 100 at operation 102 forms the device 200 that includes one or more fins (or active regions) 204 protruding from a substrate 202 and separated by isolation structures 208, a dummy gate stack 210 disposed over the fins 204, and top spacers 212 disposed on sidewalls of the dummy gate stack 210. Though not depicted, the device 200 may include other components, such as hard mask layers, barrier layers, other suitable layers, or combinations thereof, disposed over the dummy gate stack 210. The dummy gate stack 210, as will be discussed in detail below, is configured to be replaced with a metal gate stack (e.g., a high-k metal gate stack, or HKMG).

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AnnAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques.

Each fin 204 may be suitable for providing an n-type FET or a p-type FET. In some embodiments, the fins 204 as illustrated herein may be suitable for providing FETs of a similar type, i.e., both n-type or both p-type. Alternatively, they may be suitable for providing FETs of different types, i.e., an n-type and a p-type. This configuration is for illustrative purposes only and is not intended to be limiting.

In the present embodiments, each fin 204 includes a base fin 204c protruding from the substrate 202 and a stack of alternating layers 204a and 204b (collectively referred to as the "multi-layer stack" or ML) disposed over the base fin 204c. The base fins 204c may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the base fins 204c on the substrate 202. The etching process may include dry etching, wet etching, reactive ion etching (RIE), and/or other suitable processes.

Numerous other embodiments of methods for forming the base fins 204c may be suitable. For example, the base fins 204c may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the base fins 204c.

Figure 3:
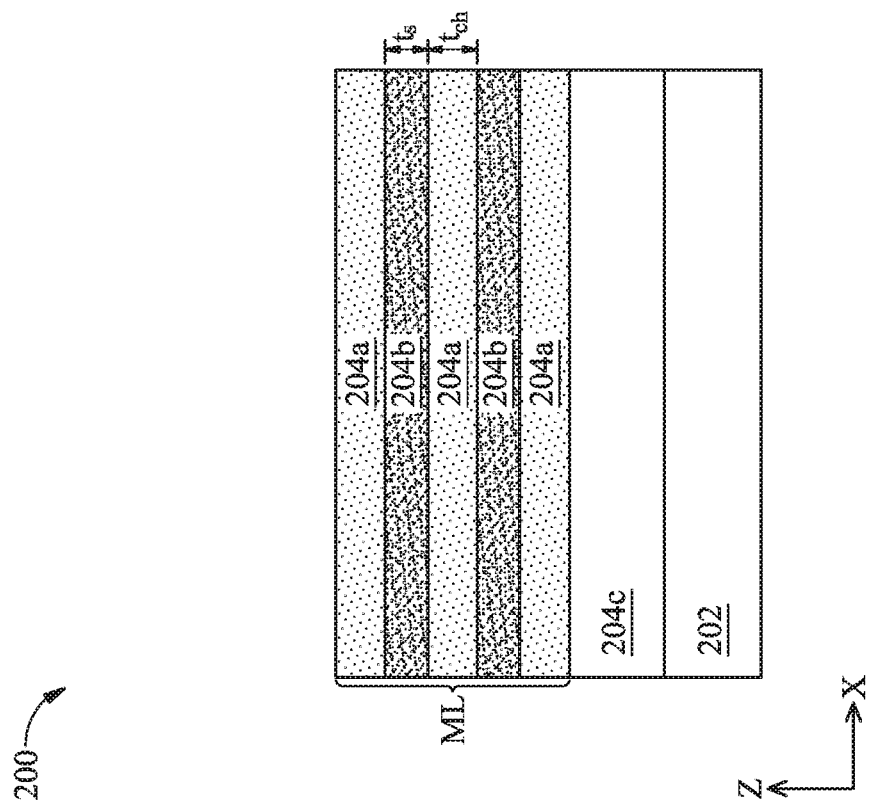

In the present embodiments, referring to the ML depicted in FIG. 3, each layer 204a includes a semiconductor material such as, for example, Si, Ge, SiC, SiGe, GeSn, SiGeSn, SiGeCSn, and/or other suitable semiconductor materials, while each layer 204b is a sacrificial layer configured to be removed at a subsequent processing step discussed in detail below. In some embodiments, the layer 204b includes a semiconductor material different from the semiconductor material of the layer 204a. In one such example, the layer 204a may include elemental Si and the layer 204b may include SiGe. In another example, the layer 204a may include elemental Si, while the layer 204b may include elemental Ge. In some embodiments, the layer 204b includes a dielectric material such as, for example, silicon oxide, silicon nitride, silicon oxynitride, and/or other suitable dielectric material. In some examples, the fin 204 may include a total of three to ten pairs of alternating layers 204a and 204b; of course, other configurations may also be applicable depending upon specific design requirements. In some examples, the layer 204a may be formed to a thickness $t_{ch}$ of about 2 nm to about 10 nm, and the layer 204b may be formed to a thickness $t_s$ of about 5 nm. In some examples, a ratio of the thickness $t_s$ to the thickness $t_{ch}$ may be about 2:5 to about 2:1. The base fins 204c, the layers 204a and/or the layers 204b may be doped with a suitable dopant, such as a p-type dopant or an n-type dopant discussed above, for forming desired FETs.

In the present embodiments, forming the ML includes alternatingly growing the layers 204a and 204b in a series of epitaxy processes. The epitaxy process may include chemical vapor deposition (CVD) techniques (for example, vaporphase epitaxy (VPE), ultra-high vacuum CVD (UHV-CVD), low-pressure (LP-CVD), and/or plasma-enhanced CVD (PE-CVD)), molecular beam epitaxy, other suitable SEG processes, or combinations thereof. The epitaxy process may use gaseous and/or liquid precursors, which interact with the composition of the underlying substrate. In some examples, the layers 204a and 204b may be provided in the form of nanosheets, nanowires, or nanorods. A sheet (or wire) release process may then remove the layers 204b (e.g., the SiGe-containing layers) to form multiple openings between the layers 204a (e.g., the Si-containing layers), and HKMGs are subsequently formed in the openings, thereby providing a GAA FET. For this reason, the layers 204a are hereafter referred to as channel layers 204a, and the layers 204b are hereafter referred to as non-channel layers (or sacrificial layers) 204b.

Multi-gate devices, such as GAA FETs, have been introduced to improve gate control by increasing gate-channel coupling, reduce OFF-state current, and reduce short-channel effects (SCEs). A GAA FET generally includes a gate structure that wraps around a plurality of horizontal semiconductor layers, thereby providing access to the channel region on all sides. The GAA FETs are generally compatible with CMOS processes, allowing them to be scaled down while maintaining gate control and mitigating SCEs. Of course, the present disclosure is not limited to forming GAA FETs only and may provide other three-dimensional FETs such as FinFETs. As such, the fin 204 may include a single layer of semiconductor material or multiple layers of different semiconductor materials not configured in an alternating stack, such that a uniform fin is provided to form a FinFET.

Because HKMGs are interleaved between channel layers in a GAA FET, inner gate spacers are provided between sidewalls of the HKMGs and portions of epitaxial source/drain (S/D) features disposed adjacent to the HKMGs to reduce parasitic capacitance of the device, which generally decreases with increasing thickness of the inner spacers. However, while inner spacers generally offer the advantage of reducing parasitic capacitance and improving device reliability in GAA FETs, they have not been entirely satisfactory in all aspect. For example, a trade-off may exist between the capacitance-reducing ability of low-k inner spacers and their low resistance against etching during the gate replacement process. To improve performance of the inner spacers in light of such trade-off, some embodiments of the present disclosure provides methods of forming inners spacers with adequate etching resistance and subsequently replacing such inner spacers with air spacers or air gap to reduce the overall parasitic capacitance in GAA FETs.

Referring back to FIG. 2A, the isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. In another embodiment, the isolation structures 208 are formed by depositing a dielectric layer as a spacer layer over the fins 204 and subsequently recessing the dielectric layer such that a top surface of the isolation structures 208 is below a top surface of the fins 204. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as CVD, flowable CVD (FCVD), spin-on-glass (SOG), other suitable methods, or combinations thereof.

Figure 4:
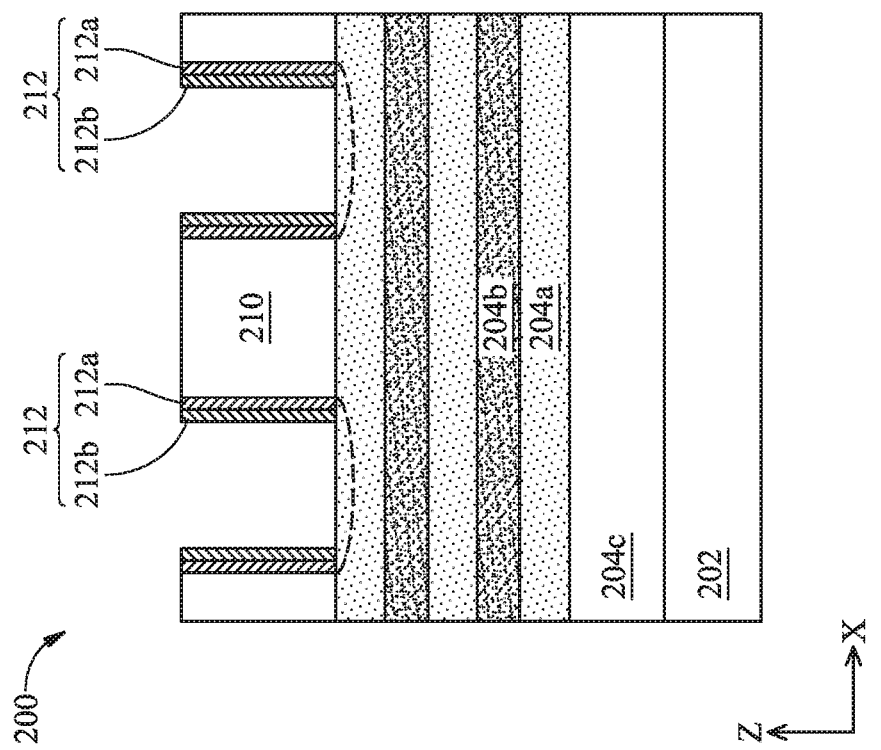

Still referring to FIGS. 2A, 2B, and 4, the dummy gate stack 210 is disposed over the fin 204 (and thus the ML) and may include polysilicon. In the present embodiments, portions of the dummy gate stack 210 are replaced with a HKMG after forming other components of the device 200. The dummy gate stack 210 may be formed by a series of deposition and patterning processes. For example, the dummy gate stack 210 may be formed by depositing a polysilicon layer over the fins 204 and performing an anisotropic etching process (e.g., a dry etching process) to remove portions of the polysilicon. In some embodiments, as depicted in FIG. 4, removing portions of the polysilicon layer may also remove a top portion of the ML, resulting in a curved upper surface as indicated by the dotted line. In some examples, forming the dummy gate stack 210 may further include forming an interfacial layer (not depicted) over the fin 204 before depositing the polysilicon layer.

Thereafter, still referring to FIG. 4, the top spacers 212 may be formed on the sidewalls of the dummy gate stack 210. The top spacers 212 may be a single-layer structure or a multilayer structure. In the depicted embodiments, the gate spacer 212 is a dual-layer spacer that includes a spacer layer 212a disposed on the sidewalls of the dummy gate stack 210 and a spacer layer 212b disposed on the top spacers 212a. Of course, the present disclosure is not limited to such configuration. For example, the top spacers 212 may have a three-layer structure. In some embodiments, one or more of the spacer layers included in the top spacers 212 are removed at a subsequent processing step to form air gaps between the HKMG and adjacent S/D contact features.

The top spacers 212 (i.e., each spacer layer included therein) may include silicon, oxygen, nitrogen, carbon, other suitable elements, or combinations thereof. For example, the top spacers 212 may include silicon oxide or $Si_xO_y$, silicon nitride or $Si_xN_y$, carbon-doped silicon oxide or $Si_xC_yN_z$, aluminum oxide or $Al_xO_y$, oxygen-doped silicon nitride or $Si_xO_yN_z$, carbon-and-oxygen-doped silicon nitride or $Si_xC_yO_zN_w$, silicon carbide or $Si_xC_y$, other suitable materials, or combinations thereof, where x, y, z, and w are any numbers suitable for providing the aforementioned compounds at various stoichiometric ratios. In some embodiments, the spacer layers 212a and 212b are configured with different compositions such that etching selectivity exists between them. In some embodiments, the spacer layers 212a and 212b include dielectric materials having different dielectric constants. In one such example, the spacer layer 212a may include silicon nitride and the spacer layer 212b may include silicon oxide, where the dielectric constant of silicon oxide is generally less than the dielectric constant of silicon nitride. In some embodiments, the spacer layers 212a and 212b are configured with similar compositions when it is more desirable to remove them together in a single etching process (discussed in detail below). Each spacer layer may be formed by first depositing a blanket dielectric layer over the device 200 and subsequently removing portions of the spacer layer in an anisotropic etching process (e.g., a dry etching process), leaving portions of the space layer on the sidewalls of the dummy gate stack 210.

Figure 6:
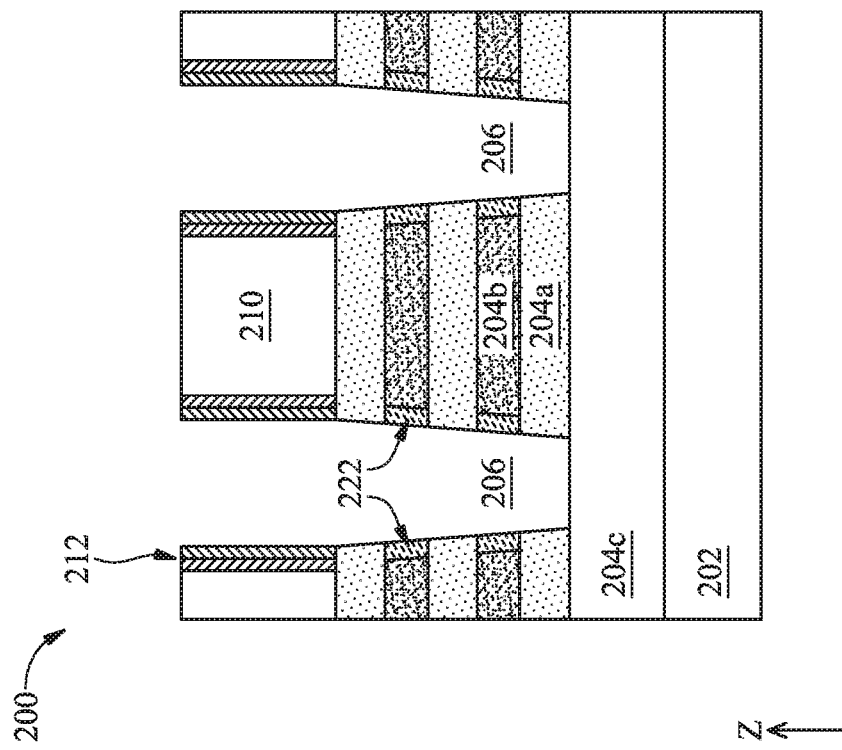
Figure 5:
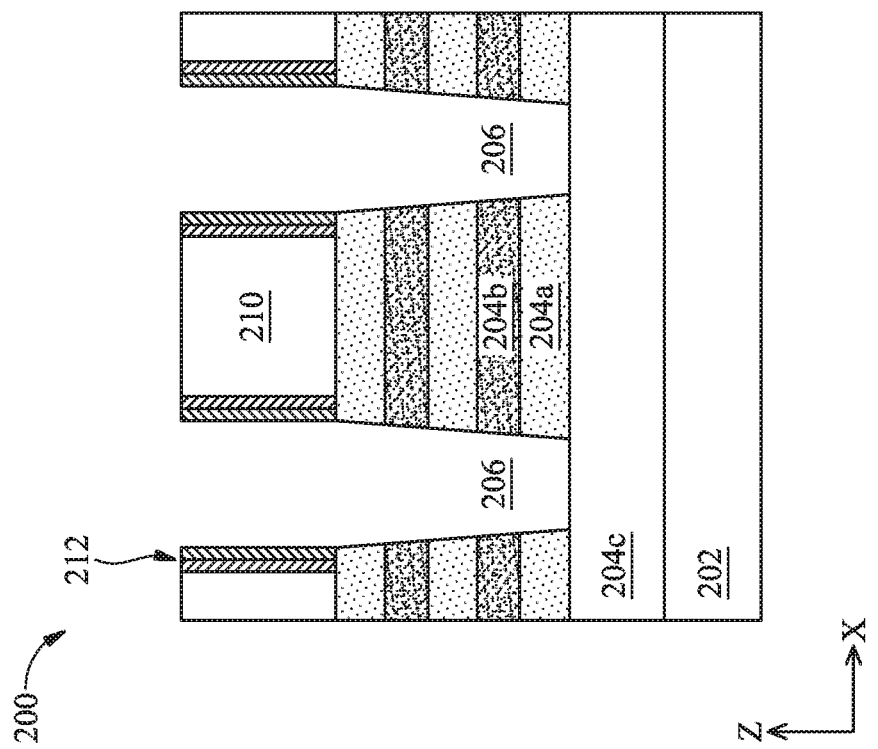

Referring to FIGS. 5 and 6, method 100 at operation 104 forms an S/D recess 206 in an S/D region of the ML and subsequently forms inner spacers 222 on sidewalls of the non-channel layers 204b exposed in the S/D recess 206. In some embodiments, the S/D recess 206 extends to below a top surface of the base fin 204c. In some embodiments, one or more etching processes are performed to remove portions of the ML disposed between two adjacent dummy gate stacks 210 to form the S/D recess 206. The etching process may include a dry etching process, a wet etching process, RIE, or combinations thereof. In some embodiments, method 300 implements a dry etching process using a suitable etchant or a combination of etchants. In some embodiments, the etching process(es) at operation 106 may be tuned by adjusting duration, temperature, pressure, source power, bias voltage, bias power, etchant flow rate, and/or other suitable parameters of the etching process(es). Depending upon the type of etching process employed, the S/D recess 206 may be defined by slanted sidewalls as depicted in FIG. 5 or, alternatively, by substantially vertical sidewalls (not depicted) generally perpendicular to the lengthwise orientation of the channel layers 204a. A cleaning process may subsequently be performed to clean the S/D recess 206 with a hydrofluoric acid (HF) solution or other suitable solution.

Thereafter, method 100 forms the inner spacers 222 on portions of the non-channel layers 204b exposed in the S/D recess 206. In the present embodiments, the inner spacers 222 are selectively formed on the non-channel layers 204b and not, or not substantially, on the channel layers 204a. The inner spacers 222 may be a single-layer structure or multi-layer structure and may include any suitable dielectric material such as silicon, oxygen, carbon, nitrogen, other suitable elements, or combinations thereof. For example, the inner spacers 222 may include silicon oxide or $Si_xO_y$, silicon nitride or $Si_xN_y$, carbon-doped silicon oxide or $Si_xC_yN_z$, aluminum oxide or $Al_xO_y$, oxygen-doped silicon nitride or $Si_xO_yN_z$, carbon-and-oxygen-doped silicon nitride or $Si_xC_yO_zN_w$, silicon carbide or $Si_xC_y$, other suitable materials, or combinations thereof, where x, y, z, and w are any positive numbers suitable for providing the aforementioned compounds at various stoichiometric ratios. In some embodiments, the composition of the inner spacers 222 may be substantially the same as or similar to the composition of the at least one of the spacer layers of the top spacers 212. In one example, the composition of the inner spacers 222 may be the same as that of the spacer layer 212b, such that the inner spacers 222 and the spacer layer 212b may be removed together by one or more etching processes.

In the present disclosure, it may be desirable for the inner spacers 222 to include a dielectric material having considerable etching resistance (i.e., with a relatively higher dielectric constant) to ensure the inner spacers 222 remain intact while removing the dummy gate stack 210 during the gate replacement process. However, if such dielectric material remains after fabrication process is completed, the parasitic capacitance in portions of the device 200 near the inner spacers 222 may be inadvertently increased, thereby compromising the performance of the device 200. The present embodiments provide methods of simultaneously removing the inner spacers 222 and the top spacers 212 after the formation of the HKMGs for purposes of lowering the overall parasitic capacitance of the device 200 while minimizing potential loss of the inner spacers 222 during the formation of the HKMGs. In many instances, preventing or minimizing spacer loss may have the advantage of protecting the S/D features from inadvertent damage and maintaining a desired gate length (of the HKMGs) according to specific design requirements.

In some embodiments, a thickness of the inner spacer 222 is substantially the same as or similar to a thickness of each spacer layer of the top spacers 212 (i.e., the thickness of the spacer layer 212a and/or the spacer layer 212b); of course, the present embodiments are not limited to such configuration. For example, a ratio of the thickness of the inner spacer 222 to the thickness of the gate spacer 212 may be about 1:n to about 1:1, where n indicates the number of spacer layers included in the gate spacer 212. In some examples, the thickness of the inner spacer 222 may be about 0.5 nm to about 7 nm, and the thickness of the gate spacer 212 may be about 0.5 nm to about 7 nm.

The inner spacers 222 may be formed by any suitable method according to aspects of the present disclosure. For example, the inner spacers 222 may be formed by first selectively removing (by dry etching, wet etching, RIE, or combinations thereof) portions of the non-channel layers 204b to form recesses (not depicted) on the sidewalls of the non-channel layers 204b. In the present embodiments, method 100 implements a dry etching process using a fluorine-based etchant, such as $CF_4$, $SF_6$, $CH_2F_2$, $CHF_3$, $C_2F_6$, other fluorine-containing etchants, or combinations thereof. The etching process at operation 106 may remove a desired amount of the non-channel layers 204b by controlling factors such as duration, temperature, pressure, source power, bias voltage, bias power, etchant flow rate, and/or other suitable parameters.

Thereafter, method 100 forms the inner spacers 222 in the recesses by depositing a dielectric material on the sidewalls of the S/D recess 206 with any suitable deposition method such as ALD, CVD, PVD, other suitable methods, or combinations thereof. In the present embodiments, the dielectric material is deposited by an ALD process. Subsequently, method 100 implements an etching process to remove portions of the dielectric material formed over the channel layers 204a. In some embodiments, sidewalls of the resulting inner spacers 222 are substantially planar with the sidewalls of the channel layers 204a. In other words, the sidewalls of the inner spacers 222 are substantially continuous with the sidewalls of the channel layers 204a. In some embodiments, the sidewalls of the resulting inner spacers 222 curve inward and away from the sidewalls of the channel layers 204a. The etching process may be any suitable process, such as dry etching, wet etching, RIE, or combinations thereof. In the present embodiments, method 100 implements a dry etching process using an etchant that includes, for example, a chlorine-containing gas (e.g., $Cl_2$, $SiCl_4$, $BCl_3$, other chlorine-containing gases, or combinations thereof), a fluorine-containing gas (e.g., $CF_4$, $SF_6$, $CH_2F_2$, $CHF_3$, $C_2F_6$, other fluorine-containing etchants, or combinations thereof), a bromine-containing gas (e.g., HBr, other bromine-containing etchants, or combinations thereof), $O_2$, $N_2$, $H_2$, Ar, other suitable gases, or combinations thereof. The choice of etchant (or a combination of etchants) is not limited in the present embodiments and may depend upon the specific composition of the inner spacers 222. In some embodiments, the etching process is stopped when the sidewalls of the channel layers 204a are exposed.

Figure 7:
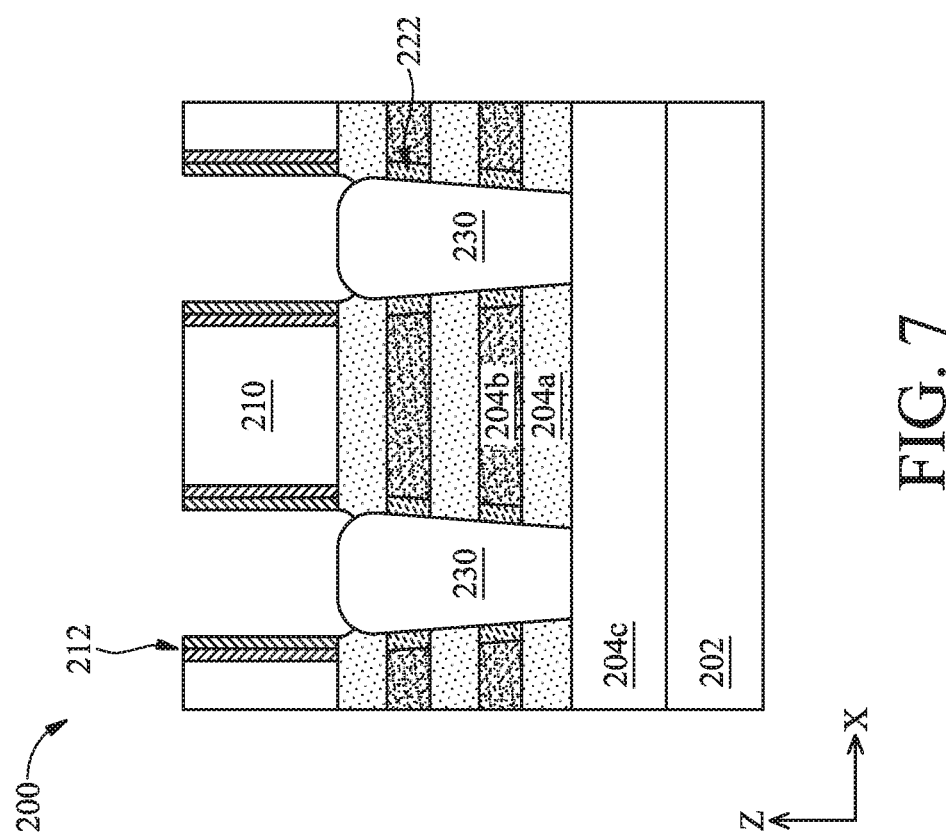

Now referring to FIG. 7, method 100 at operation 108 forms an S/D feature 230 in each of the S/D recess 206. In the depicted embodiment, the S/D features 230 physically contact sidewalls of the inner spacers 222. The S/D features 230 may be formed by any suitable process. In some embodiments, one or more epitaxial growth processes are performed to grow an epitaxial material in the S/D recess 206. For example, method 300 may implement an epitaxial growth process as discussed above with respect to forming the ML.

Each of the S/D features 230 may be suitable for forming a p-type FinFET device (e.g., including a p-type epitaxial material) or alternatively, an n-type FinFET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the S/D features 230.

Referring to FIGS. 8 and 9, method 100 at operation 110 removes the dummy gate stacks 210 to form gate trenches 250 between the top spacers 212. In the present embodiments, referring to FIG. 8, removing the dummy gate stacks 210 begins with forming an etch stop layer (ESL) 240 over the S/D features 230 and an interlayer dielectric (ILD) layer 242 over the ESL 240. The ESL 240 may include silicon, oxygen, nitrogen, carbon, other suitable elements, or combinations thereof. For example, the ESL 240 may include silicon oxide or $Si_xO_y$, silicon nitride or $Si_xN_y$, carbon-doped silicon oxide or $Si_xC_yN_z$, aluminum oxide or $Al_xO_y$, oxygen-doped silicon nitride or $Si_xO_yN_z$, carbon-and-oxygen-doped silicon nitride or $Si_xC_yO_zN_w$, silicon carbide or $Si_xC_y$, other suitable materials, or combinations thereof, where x, y, z, and w are any positive numbers suitable for providing the aforementioned compounds at various stoichiometric ratios. The ESL 240 may be formed by CVD, PVD, ALD, other suitable methods, or combinations thereof.

In some embodiments, the ESL 240 have a composition similar to one or more of the spacer layers included in the top spacers 212. For example, the composition of the ESL 240 may be similar to that of the spacer layer 212a, 212b, and/or any other spacer layer included in the top spacers 212. As such, in the present embodiments, the etching selectivity between the ESL 240, the spacer layer 212a, and the spacer layer 212b may be adjusted to any value (by adjusting their respective composition, for example) to accommodate subsequent processing steps. For example, it may be desirable to minimize the etching selectivity between the ESL 240 and the spacer layer 212b and maximize the etching selectivity between the ESL 240, the spacer layer 212a, the channel layers 204a, and a subsequently formed high-k gate dielectric layer (e.g., high-k gate dielectric layer 262 discussed in detail below), such that the ESL 240 and the spacer layer 212b can be selectively removed by a single etching process without removing, or substantially removing, the spacer layer 212a and the high-k gate dielectric layer.

The ILD layer 242 may include silicon oxide, a low-k dielectric material, TEOS, doped silicon oxide (e.g., BPSG, FSG, PSG, BSG, etc.), other suitable dielectric materials, or combinations thereof. In the present embodiments, the ILD layer 242 includes silicon oxide, which is similar to the composition of the top spacers 212 (e.g., the spacer layer 212a or the spacer layer 212b). Thereafter, though not depicted, method 100 may planarize the ILD layer 242 in one or more CMP processes to expose a top surface of the dummy gate stacks 210. Referring to FIG. 9, method 100 subsequently removes at least portions of the dummy gate stacks 210 to form the gate trenches 250 by any suitable etching process, such as a dry etching process.

Figure 10:
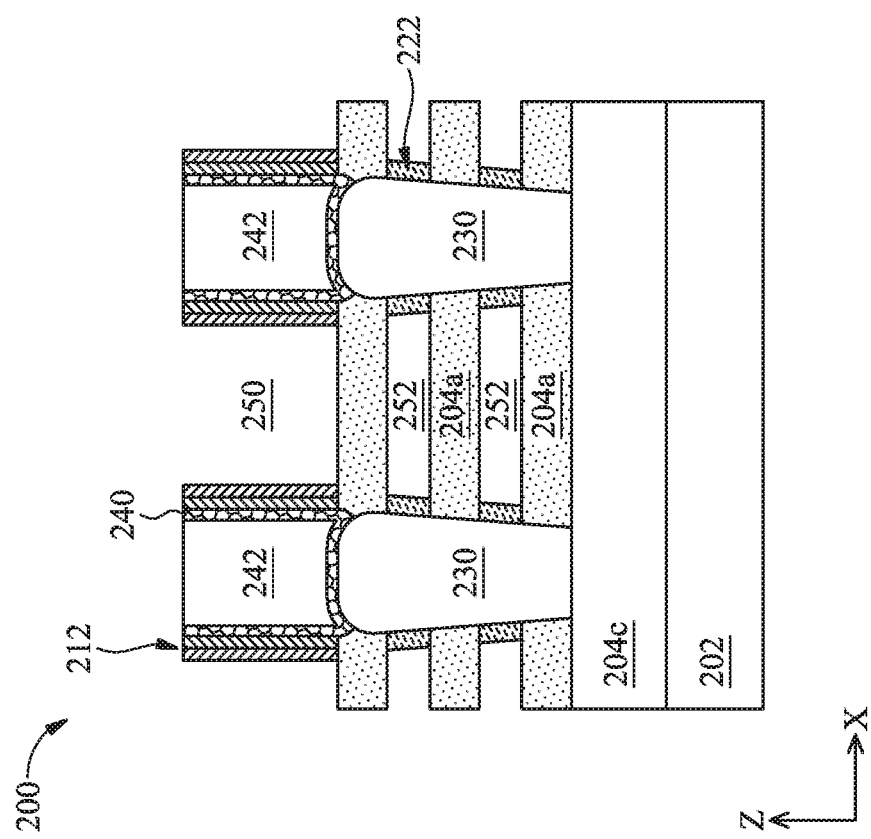

Referring to FIG. 10, method 100 at operation 112 removes the non-channel layers 204b to form openings 252 between the channel layers 204a. In the present embodiments, method 100 selectively removes the non-channel layers 204b without removing, or substantially removing, the channel layers 204a. This may be accomplished by ensuring that sufficient etching selectivity exists between at least the non-channel layers 204b, the channel layers 204a, and the inner spacers 222. The non-channel layers 204b may be selectively removed by any suitable etching process, such as dry etching, wet etching, RIE, or combinations thereof. In one example, a wet etching process employing hydrogen peroxide ($H_2O_2$) may be performed to selectively remove the non-channel layers 204b that includes, for example, Ge. In another example, a dry etching process employing HF and/or another fluorine-based etchant may be implemented during the sheet release process to remove the non-channel layers 204b.

Figure 11:
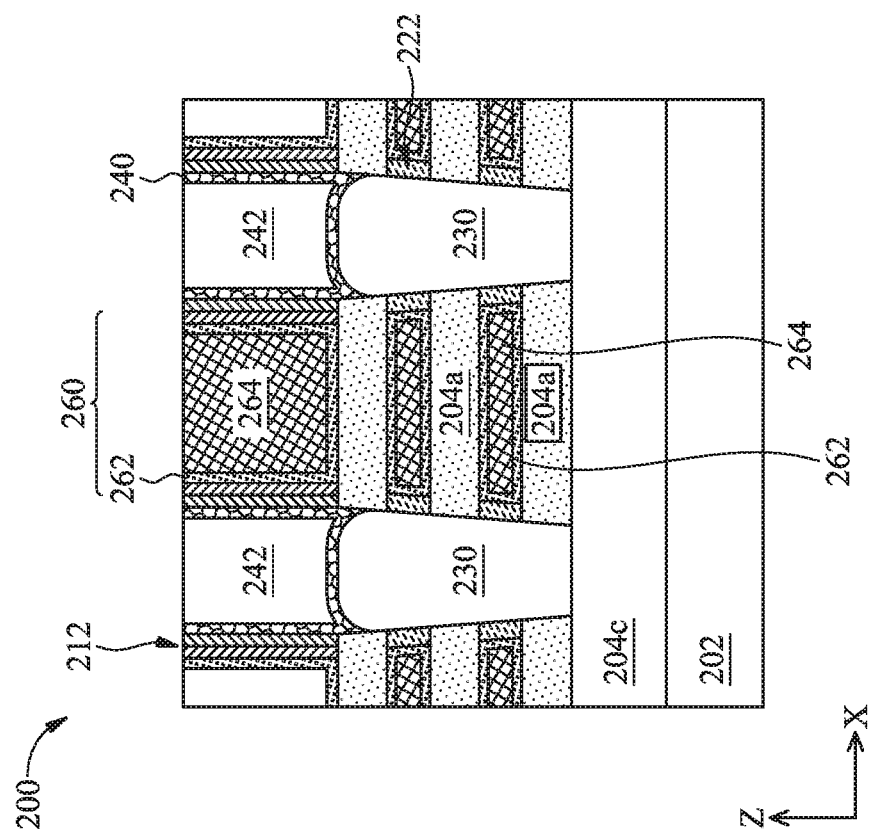

Referring to FIG. 11, method 100 at operation 114 forms HKMGs 260 in the gate trenches 250 and the openings 252. In the present embodiments, HKMGs 260 are formed between the top spacers 212 to replace the dummy gate stacks 210 as well as between the inner spacers 222. Each HKMG 260 includes at least a high-k dielectric layer 262 disposed in the gate trenches 250 and in the openings 252 and a metal gate electrode 264 disposed over the high-k dielectric layer 262. In the present embodiments, for each HKMG 260 formed in the gate trench 250, sidewall portions of the high-k dielectric layer 262 are formed on the top spacers 212, while a bottom portion of the high-k dielectric layer 262 is formed on the channel layer 204a, such that the high-k dielectric layer 262 is configured to be a U shape. For portions of the HKMGs 260 formed in the opening 252, sidewall portions of the high-k dielectric layer 262 are formed over the inner spacers 222, while top and bottom portions of the high-k dielectric layer 262 are formed over the channel layers 204a, such that the high-k dielectric layer 262 is completely enclosed by the channel layers 204a and the inner spacers 222.

The high-k dielectric layer 262 may include any suitable high-k dielectric material, such as hafnium oxide, lanthanum oxide, other suitable materials, or combinations thereof. The metal gate electrode 264 may further include at least one work function metal layer and a bulk conductive layer disposed thereover. The work function metal layer may be a p-type or an n-type work function metal layer. Example work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include Cu, W, Al, Co, other suitable materials, or combinations thereof. Each HKMG 260 may further include numerous other layers (not depicted), such as an interfacial layer disposed between the channel layer 204a and the high-k dielectric layer 262, capping layers, barrier layers, other suitable layers, or combinations thereof. In some embodiments, the number of material layers included in each HKMG 260 is determined by the size of the opening 252 disposed between the channel layers 204a. Various layers of the HKMG 260 may be deposited by any suitable method, such as chemical oxidation, thermal oxidation, ALD, CVD, PVD, plating, other suitable methods, or combinations thereof.

Figure 12:
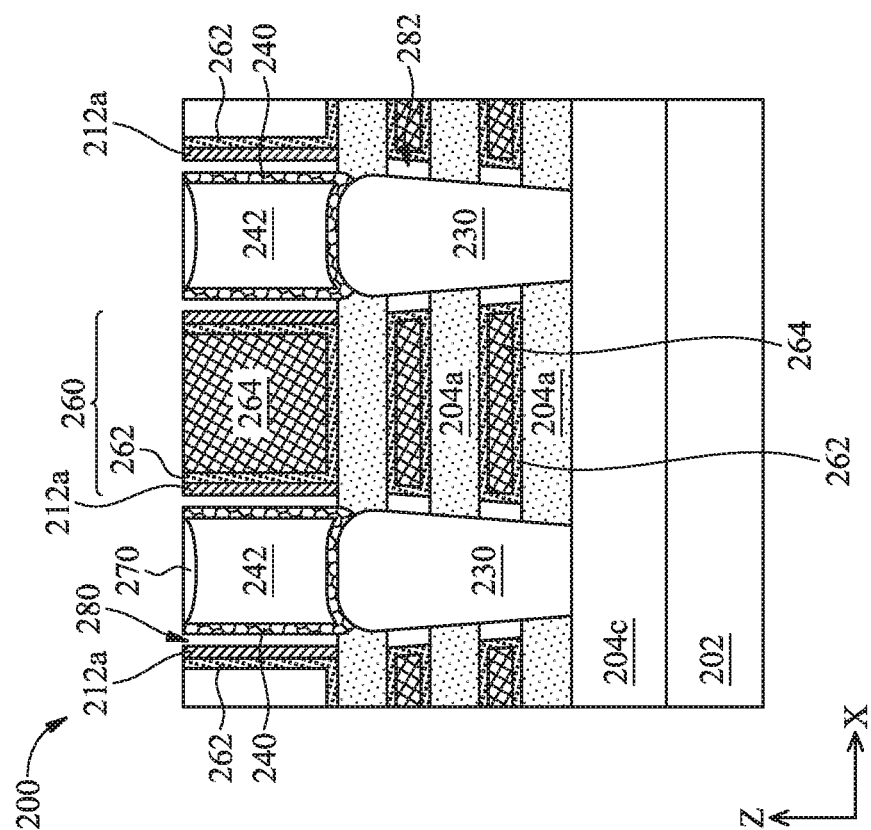
Figure 13:
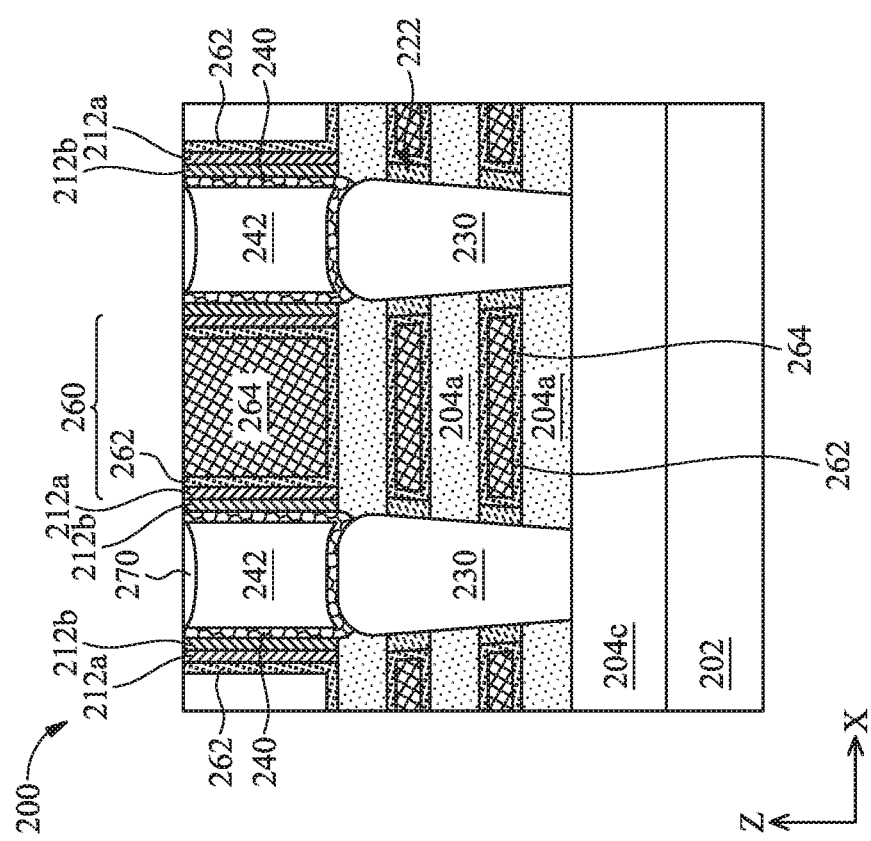
Figure 14:
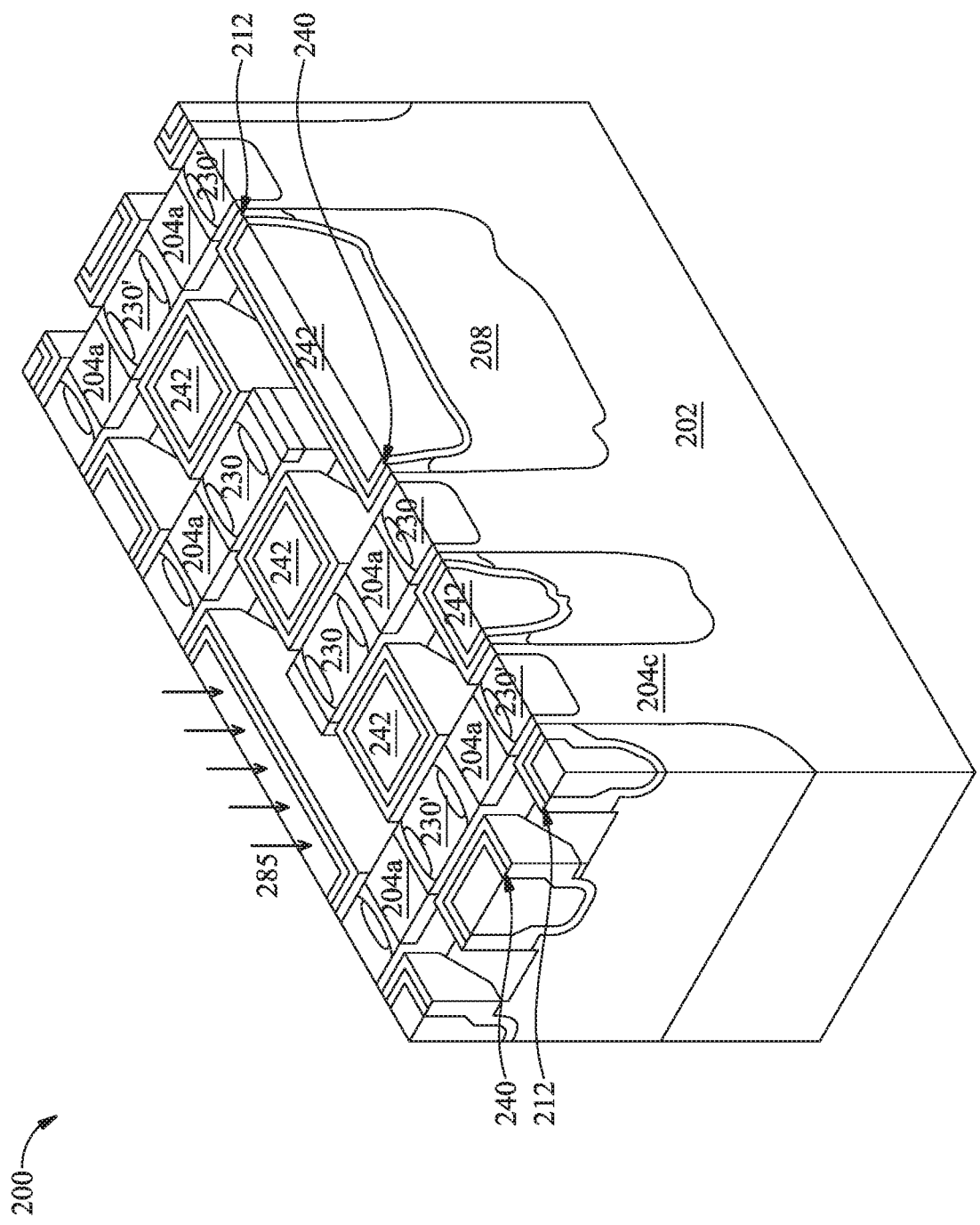

Now referring to FIGS. 12 and 13, method 100 at operation 116 removes the top spacers 212 and the inner spacers 212 from the device 200 to form air gaps 280 and 282, respectively. Referring to FIG. 12, method 100 first forms a helmet 270 over portions of the device 200 before forming the air gaps 280 and 282. In the present embodiments, because the ILD layer 242 generally includes an oxide material (e.g., silicon oxide), which may be similar to the composition of a portion of the top spacers 212 (i.e., the spacer layer 212a and/or the spacer layer 212b), the helmet 270 is configured to protect portions of the ILD layer 242 disposed adjacent to the top spacers 212 from being damaged during the spacer removal process. As such, the composition of the helmet 270 is distinctly different from the composition of the top spacers 212, such that sufficient etching selectivity exists between the helmet 270 and the top spacers 212 (or any portion thereof). In some examples, the helmet 270 may include a nitride, such as silicon nitride, oxygen-doped silicon nitride, carbon-doped silicon nitride, other suitable materials, or combinations thereof. In some embodiments, the helmet 270 includes a dielectric material having a higher dielectric constant than the top spacers 212 (or any portion thereof).

The helmet 270 may be formed by first selectively removing top portions of the ILD layer 242 to form a recess (not depicted). The ILD layer 242 may be selectively etched by any suitable method such as a wet etching process utilizing HF as an etchant. Thereafter, a dielectric layer is formed over the device 200, thereby filling the recess. In the present embodiments, a thickness of the helmet 270 is determined based on the etching selectivity between the helmet 270 and the top spacers 212. For example, a low etching selectivity may indicate a need for a thicker helmet 270 and vice versa. Of course, the specific thickness of the helmet 270 is not limited by the present embodiments but is rather adjustable based on the compositions of the helmet 270 and the top spacers 212. The device 200 is then planarized using one or more CMP processes to remove any excess dielectric material to form the helmet 270 and to expose a top surface of the HKMGs 260.

Referring now to FIG. 13, method 100 subsequently removes at least portions of the top spacers 212 as well as the inner spacers 222 from the device 200, thereby forming air gaps 280 and 282, respectively. FIG. 13 illustrates an example embodiment in which method 100 selectively removes the spacer layer 212b from the device 200, such that the spacer layer 212a having a different composition from the spacer layer 212b is not removed or not substantially removed. The remaining spacer layer 212a is configured to protect the HKMGs 260 from any inadvertent damages caused by the subsequent processing steps. In some embodiments, method 100 removes the spacer layer 212a instead of the spacer layer 212b. In some embodiments, method 100 removes both the spacer layers 212a and 212b, such that the top spacers 212 are completely removed from the device 200. If more than two spacers layers are included in the top spacers 212, any combinations of the spacers layers (including at least one spacer layer) may be removed according to various embodiments of the present disclosure. In some embodiments, method 100 removes the ESL 240 from the device 200 in addition to removing one or more spacer layers of the top spacers 212.

For the present embodiments in which the spacer layer 212b is removed, the composition of the spacer layer 212b and the composition of the inner spacers 222 are selected to be substantially the same as or similar to ensure that a minimal etching selectivity exists between them. For example, the spacer layer 212b and the inner spacers 222 may both include an oxide material, such as silicon oxide. Alternatively, the spacer layer 212b and the inner spacers 222 may both include a nitride-based material, such as silicon nitride, oxygen-doped silicon nitride (e.g., silicon oxynitride), and/or carbon-doped silicon nitride (e.g., silicon carbonitride). As will be discussed in detail below, the minimal etching selectivity allows the spacer layer 212b and the inner spacers 222 to be removed in a single etching process at operation 116. In some embodiments, the composition of the spacer layer 212b is different from the composition of the inner spacers 222, such that the spacer layer 212b and the inner spacers are removed by separate etching processes.

Referring to FIG. 14, which illustrates the device 200 from a three-dimensional perspective view different from that of FIG. 2A, arrows labeled 285 indicate the direction of etching at operation 116 that results in the formation of the air gaps 280 and 282. As depicted herein, the device 200 may additionally provide S/D features 230', which are configured to form a transistor having a conductivity type that is the same as or different from the conductivity type of the S/D features 230. For example, if the S/D features 230 are configured to form a p-type transistor (i.e., including an epitaxial semiconductor material doped with a p-type dopant such as boron, indium, other p-type dopants, or combinations thereof), the S/D features 230' may be configured to form a p-type transistor or an n-type transistor (i.e., including an epitaxial semiconductor material doped with an n-type dopant such as arsenic, phosphorus, other n-type dopants, or combinations thereof).

FIGS. 15A and 15B depict planar top views of a portion of the device 200 shown in FIG. 14, with FIG. 15A illustrating the device 200 before implementing operation 116 and FIG. 15B illustrating the device 200 after implementing operation 116. In some embodiments, as depicted in FIG. 15A, the top spacers 212 (e.g., the spacer layer 212b) are in contact with the inner spacers 222 at corners of the channel layers 204a (i.e., the channel regions of the device 200) as indicated by the dotted circles. In other words, the inner spacers 222 are configured to connect portions of the top spacers 212 interposed between neighboring transistors as shown in a planar top view. As discussed above, the spacer layer 212b and the inner spacers 222 may be selected to have substantially the same or similar compositions. Accordingly, when implementing the etching process at operation 116, the spacer layer 212b and the inner spacers 222 may be removed in one etching process, resulting in the air gaps 280 and 282 to merge at the corners of the channel layers 204a as indicated by dotted circles in FIG. 15B. In the present embodiments, method 100 at operation 116 replaces the inner spacers 222 and at least a portion of the top spacers 212 with air, which has a lower dielectric constant than the compositions of the inner spacers 222 and the top spacers 212, such that the overall parasitic capacitance of the device 200 may be reduced.

Figures 16, 17:
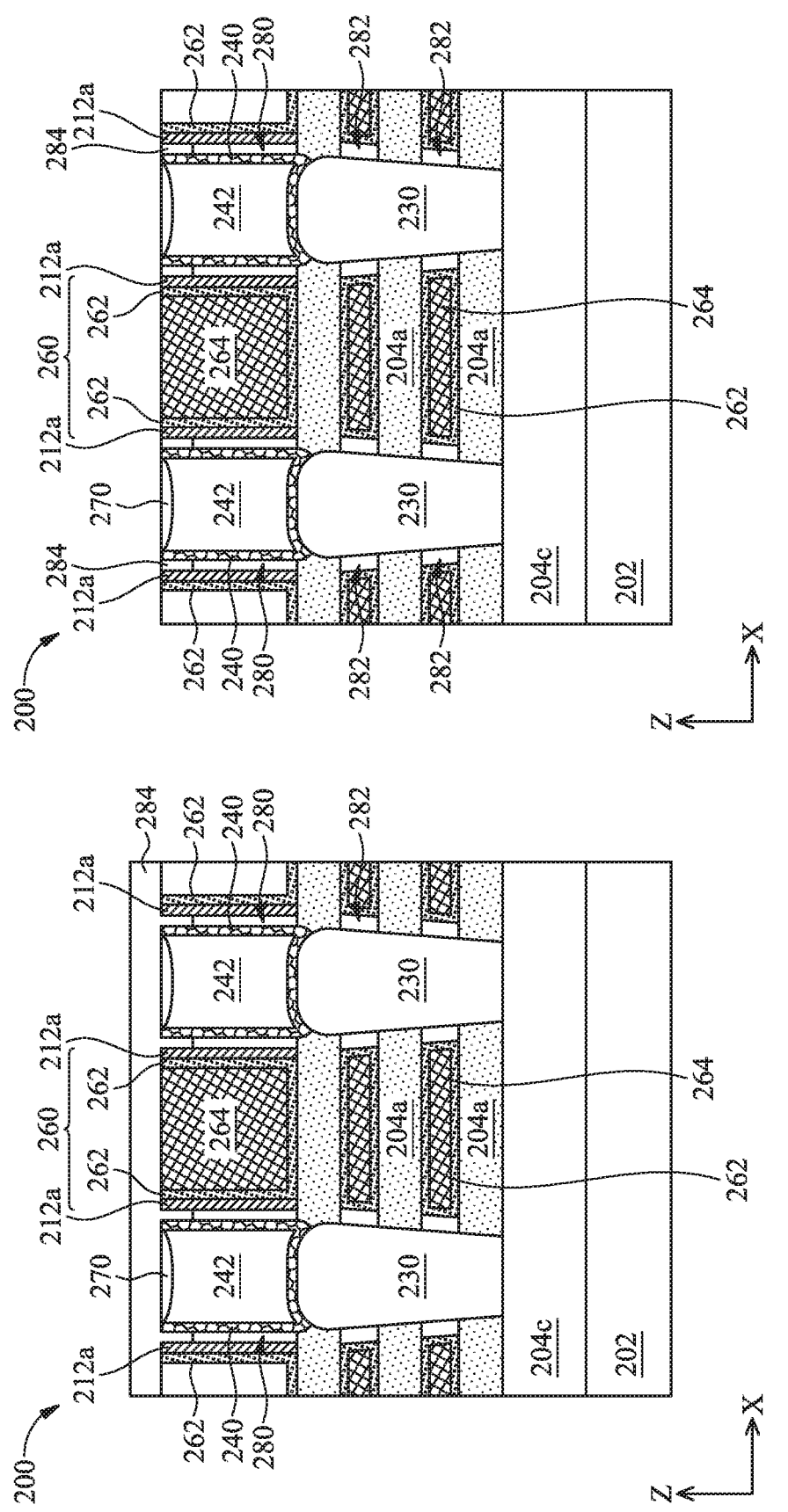

Referring to FIGS. 16 and 17, method 100 at operation 118 caps the air gaps 280 with a seal layer 284. Referring to FIG. 16, method 100 deposits the seal layer 284 over the device 200, such that portions of the seal layer 284 may penetrate the air gap 280 and seal top portions of the air gap 280. The seal layer 284 may include any suitable material, such as a low-k dielectric material, silicon oxide, silicon, silicon nitride, carbon-doped silicon nitride, oxygen-doped silicon nitride, silicon carbide, other suitable materials, or combinations thereof. The seal layer 284 may be deposited by any suitable method, such as CVD, FCVD, ALD, PVD, other suitable methods, or combinations thereof. In the present disclosure, the seal layer 284 may be deposited by a CVD method and deposition parameters (e.g., gas flow rate, gas pressure, ratios of a mixture of gases) may be adjusted to control a thickness (i.e., the amount) of the seal layer 284. Subsequently, referring to FIG. 17, method 100 implements one or more CMP processes to planarize the top surface of the device 200, thereby removing the helmet 270 and exposing the top surface of the HKMGs 260. In the present embodiments, the portions of the seal layer 284 remaining in the air gap 280 prevent any undesirable chemicals (e.g., etchants, solvents, etc.) from penetrating the air gap 280 and inadvertently damage features disposed below the air gap 280 (e.g., the S/D features 230).

Thereafter, referring to FIGS. 18A-18D, method 100 at operation 120 forms S/D contacts 290 over the S/D features 230. Each S/D contact may include a bulk conductive layer 294 disposed over a barrier layer 292. The bulk conductive layer may include any suitable conductive material, such as Co, W, Ru, Cu, Al, Ti, Ni, Au, Pt, Pd, other suitable conductive materials, or combinations thereof. The barrier layer 292 may include TiN, TaN, other suitable materials, or combinations thereof, and may be formed by any suitable process, such as an ALD process. In some embodiments, the barrier layer 292 is optional, such that the bulk conductive layer 294 contacts portions of the ILD layer 242 and the S/D features 230 (or any material layers disposed thereover). Method 100 may form an S/D contact opening in the ILD layer 242 via a series of patterning and etching processes and subsequently deposit a conductive material in the S/D contact opening using any suitable method, such as CVD, ALD, PVD, plating, other suitable processes, or combinations thereof. In some embodiments, a silicide layer (not depicted) is formed between the S/D features 230 and the S/D contacts 290. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. For example, a metal layer (e.g., titanium) may be deposited over the S/D features 230, and the device 200 is annealed to allow the metal layer and the semiconductor materials of the S/D features 230 to react. Thereafter, the un-reacted metal layer is removed, leaving the silicide layer over the S/D features 230. Subsequently, method 100 at operation 122 may form additional features over the device 200 such as, for example, gate contacts over the HKMGs 260, vertical interconnect features (e.g., vias), horizontal interconnect features (e.g., conductive lines), dielectric layers (e.g., intermetal dielectric layers), other suitable features, or combinations thereof.

Figure 18A:
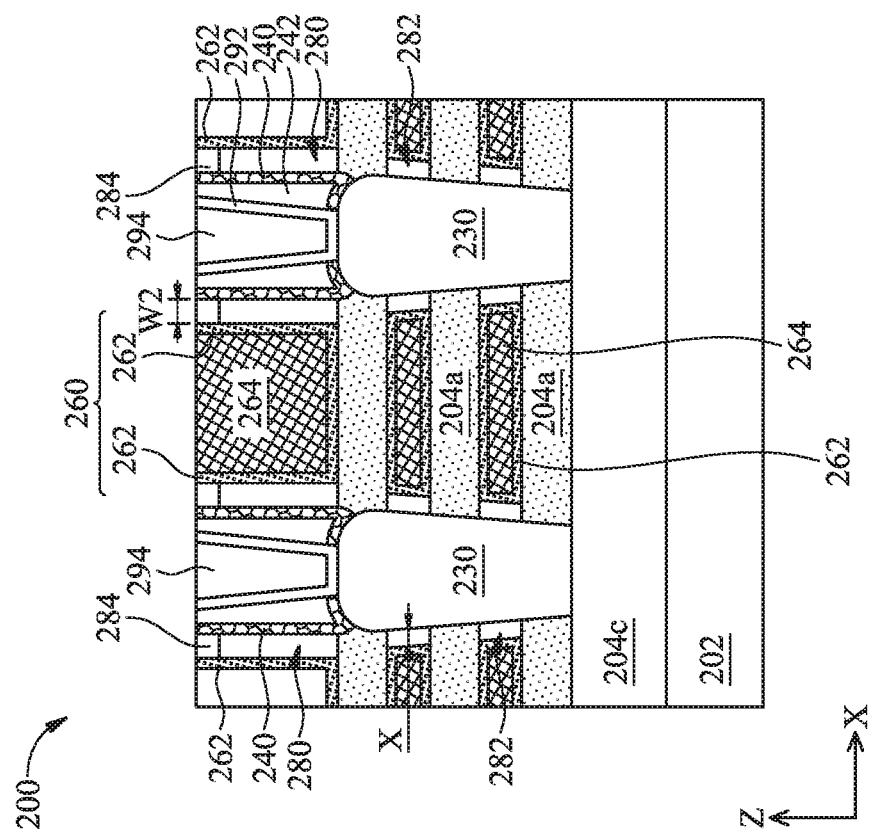
Figure 18B:
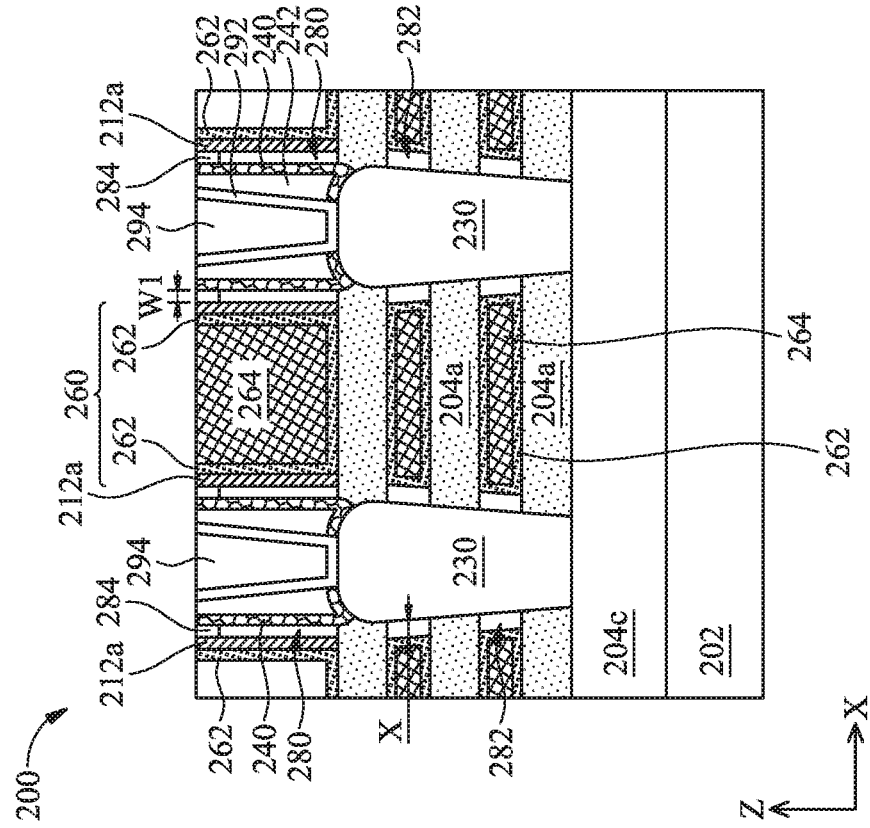
Figures 18C, 18D:
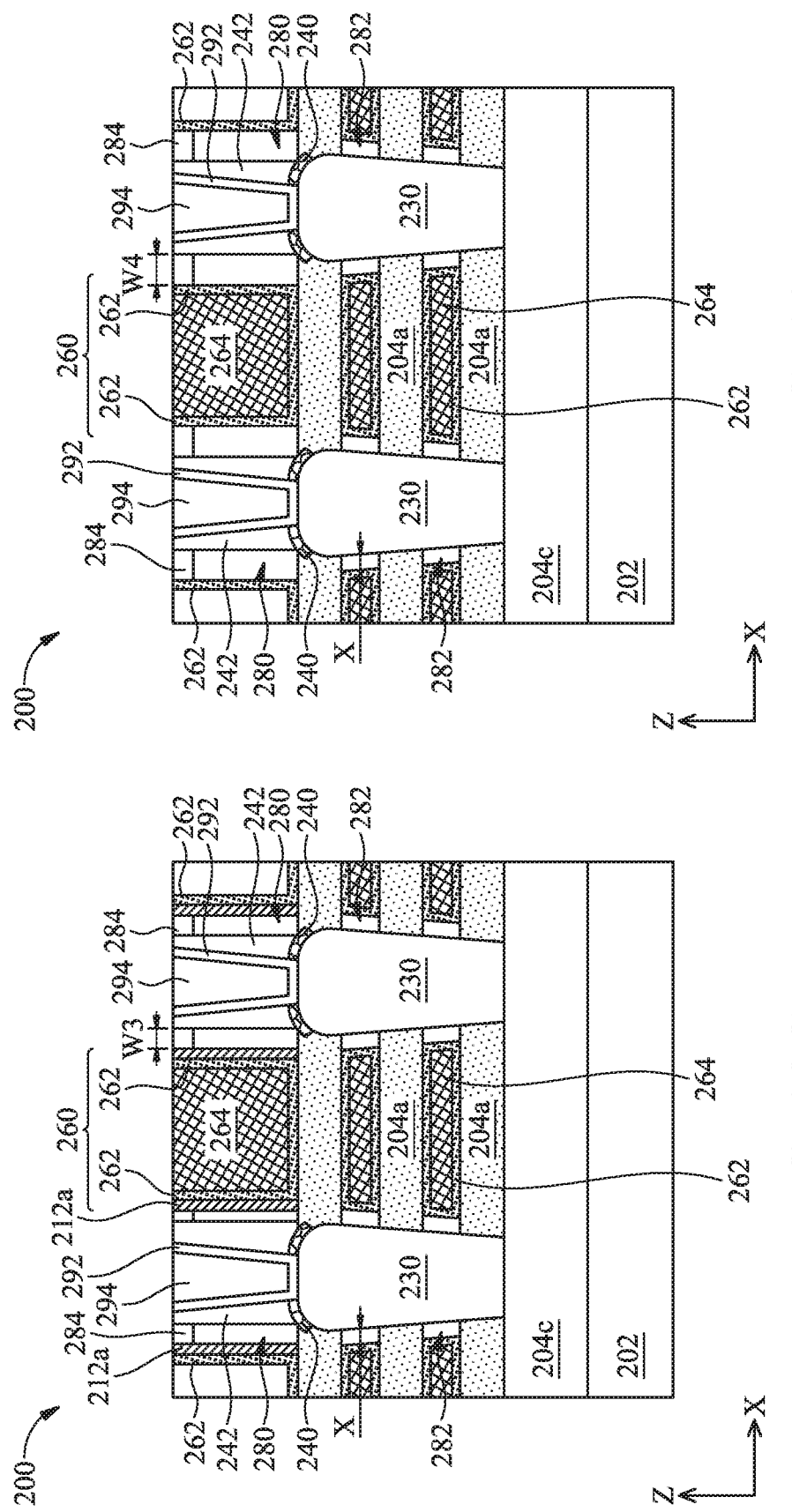

FIGS. 18A-18D depict various embodiments of the device 200 based on which material layer(s) is/are removed at operation 116, resulting in air gaps between the HKMGs 260 and the S/D contacts 290 with different widths. FIG. 18A illustrates an example embodiment in which the spacer layer 212b is selectively removed, the air gap 280 formed between the spacer layer 212a and the ESL 240 may be defined by a width W1. FIG. 18B illustrates an example embodiment in which both the spacer layers 212a and 212b are selectively removed with respect to the ESL 240, resulting in the air gap 280 having a width W2 greater than the width W1. FIG. 18C illustrate an example embodiment in which the spacer layer 212b and the ESL 240 are selectively removed with respect to the spacer layer 212a, resulting in the air gap 280 having a width W3 greater than the width W1. FIG. 18D illustrates an example embodiment in which the spacer layers 212a and 212b as well as the ESL 240 are removed, resulting in the air gap 280 having a width W4 greater than the widths W1, W2, and W3. In some examples, a width X of the air gap 282 may be similar to W1, which may be less than or equal to W2. In further examples, W2 may be substantially similar to W3. Specific dimensions of the air gaps resulting from the removed top spacers 212 and inner spacers 222 may vary based on different design requirements for the device 200 and are thus not limited by the present embodiments.

In some embodiments, the channel layers 204a of the device 200 may be arranged in various configurations. In one example, referring to FIG. 19A, which is a cross-sectional view (in the YZ plane) of the device 200 taken along dotted line BB' as shown in FIGS. 2A and 2B, a length L1 of the channel layer 204a closest to the substrate 202 (i.e., on the bottom of the ML) is the greatest, and a length L3 of the channel layer 204a farthest away from the substrate 202 (i.e., on the top of the stack) is the smallest. In other words, L1>L2>L3 as depicted in FIG. 19A. In another example, referring to FIG. 19B, the length L1 may be the smallest and the width L3 may be the greatest. In other words, L1<L2<L3 as depicted in FIG. 19B. In some embodiments, a ratio of the minimum length to the maximum length may be about 2:5 to about 1:1.

Furthermore, referring to FIG. 20, the cross-sectional view of the channel layers 204a depicted herein may be configured to various profiles. In one embodiment, the channel layers 204a may have a substantially rectangular cross-sectional profile 310. In another embodiment, the channel layers 204a may have a substantially rounded rectangular cross-sectional profile 320. In yet another embodiment, the channel layers 204a may have a substantially rounded trapezoid cross-sectional profile 330. In one more embodiment, the channel layers 204a may have a substantially circular cross-sectional profile 340. Other suitable profiles may include squares (including rounded squares) or triangles (including rounded triangles). In embodiments where the profile is rounded (e.g., rounded rectangle or square, etc.), it is understood that a rounding ratio may be defined as Lr/Ls, where Lr represents the length of the rounded or curved segment, and Ls represents the straight segment. In some examples, the rounding ratio may be in a range between about 15:100 and about 1:1.

Although not intended to be limiting, one or more embodiments of the present disclosure provide many benefits to a semiconductor device and the formation thereof. For example, the present disclosure provides methods of forming air spacers (i.e., air gaps) to reduce the overall parasitic capacitance in GAA FETs. In the present embodiments, forming air spacers includes first forming inner spacers containing a dielectric material with considerable etching resistance (i.e., with a relatively higher dielectric constant) to ensure that the inner spacers remain intact during a subsequent metal gate replacement process. Such inner spacers may then be removed while removing top gate spacers after forming the metal gates. Accordingly, embodiments of the present disclosure result in lowered parasitic capacitance in the GAA FETs while minimizing potential loss of inner spacers during the fabrication process. In many instances, preventing or minimizing spacer loss may have the advantage of protecting nearby S/D features from inadvertent damage and maintaining a desired gate length (of the subsequently-formed metal gates) according to specific design requirements.

In one aspect, the present disclosure provides a semiconductor structure that includes a stack of semiconductor layers disposed over a substrate, a first metal gate stack disposed over the stack of semiconductor layers, a second metal gate stack interleaved between the stack of semiconductor layers, a source/drain (S/D) feature disposed in the stack of semiconductor layers, and an S/D contact disposed over the S/D feature. In the present embodiments, the S/D feature is separated from a sidewall of the second metal gate stack by a first air gap and the S/D contact is separated from a sidewall of the first metal gate stack by a second air gap.

In another aspect, the present disclosure provides a semiconductor structure that includes a stack of channel layers disposed over a semiconductor fin, S/D features disposed over the semiconductor fin, where the stack of channel layers is interposed between the S/D features, a metal gate structure (MG) disposed between the S/D features, where a top portion of the MG is disposed over the stack of channel layers and a bottom portion of the MG is interleaved between the stack of channel layers, an interlayer dielectric (ILD) layer disposed over the S/D features, and an S/D contact disposed in the ILD layer and electrically coupled to one of the S/D features. In the present embodiments, the semiconductor structure further includes a first air gap disposed between a sidewall of the ILD layer and a sidewall of the top portion of the MG and a second air gap disposed between the S/D features and a sidewall of the bottom portion of the MG, such that portions of the first air gap and the second air gap are merged.

In yet another aspect, the present disclosure provides a method that includes forming a dummy gate stack over a fin protruding from a semiconductor substrate, where the fin includes a multi-layer stack (ML) of alternating channel layers and non-channel layers, forming gate spacers on sidewalls of the dummy gate stack, forming a recess in an S/D region of the ML, and forming inner spacers on sidewalls of the non-channel layers exposed in the recess, where the inner spacers are embedded in the non-channel layers. In the present embodiments, the method further includes forming an epitaxial S/D feature in the recess, such that the epitaxial S/D feature contacts the inner spacers, subsequently removing the non-channel layers from the ML to form openings interleaved between the channel layers, forming high-k metal gate stacks (HKMGs) in the openings and in place of the dummy gate stack, and removing the gate spacers after forming the HKMGs, wherein removing the gate spacers removes the inner spacers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a stack of semiconductor layers disposed over a substrate;
a first metal gate stack disposed over the stack of semiconductor layers;
a second metal gate stack interleaved between the stack of semiconductor layers;
a source/drain (S/D) feature disposed in the stack of semiconductor layers, wherein the S/D feature is separated from a sidewall of the second metal gate stack by a first air gap, and wherein the first air gap exposes a sidewall of the second metal gate stack; and
an S/D contact disposed over the S/D feature, wherein the S/D contact is separated from a sidewall of the first metal gate stack by a second air gap.

2. The semiconductor structure of claim 1, wherein the S/D contact is disposed in an interlayer dielectric (ILD) layer, and wherein the ILD layer is separated from the sidewall of the first metal gate stack by the second air gap.

3. The semiconductor structure of claim 2, further comprising an etch-stop layer disposed between a bottom surface of the ILD layer and a top surface of the S/D feature, wherein a sidewall of the ILD layer is free of the etch-stop layer.

4. The semiconductor structure of claim 2, further comprising an etch-stop layer defining bottom and sidewall surfaces of the ILD layer, such that the second air gap is disposed between the etch-stop layer and the sidewall of the first metal gate stack.

5. The semiconductor structure of claim 1, wherein the sidewall of the first metal gate stack includes a gate spacer disposed thereon, such that the second air gap is disposed between the S/D contact and the gate spacer.

6. The semiconductor structure of claim 5, further comprising an etch-stop layer disposed over the S/D feature and an interlayer dielectric (ILD) layer disposed over the etch-stop layer, such that the S/D contact extends through the etch-stop layer and the second air gap is disposed between the etch-stop layer and the gate spacer.

7. The semiconductor structure of claim 1, wherein the second air gap is capped by a seal layer.

8. A semiconductor structure, comprising:
a stack of channel layers disposed over a semiconductor fin;
source/drain (S/D) features disposed over the semiconductor fin, wherein the stack of channel layers is interposed between the S/D features;
a metal gate structure (MG) disposed between the S/D features, wherein a top portion of the MG is disposed over the stack of channel layers and a bottom portion of the MG is interleaved between the stack of channel layers;
an interlayer dielectric (ILD) layer disposed over the S/D features;
an S/D contact disposed in the ILD layer and electrically coupled to one of the S/D features;
a first air gap disposed between a sidewall of the ILD layer and a sidewall of the top portion of the MG; and
a second air gap disposed between the S/D features and a sidewall of the bottom portion of the MG, wherein portions of the first air gap and the second air gap are merged, and wherein the second air gap exposes the bottom portion of the MG.

9. The semiconductor structure of claim 8, wherein the sidewall of the top portion of the MG includes a top spacer disposed thereon, such that the first air gap is disposed between the sidewall of the ILD layer and the top spacer.

10. The semiconductor structure of claim 9, wherein composition of the top spacer is substantially similar to that of the ILD layer.

11. The semiconductor structure of claim 8, further comprising an etch-stop layer (ESL) disposed between a bottom portion of the ILD layer and a top portion of the S/D features.

12. The semiconductor structure of claim 11, wherein the sidewall of the ILD layer is free of the ESL.

13. The semiconductor structure of claim 8, wherein a top portion of the first air gap is sealed by a dielectric layer.

14. A method, comprising:
 forming a dummy gate stack over a fin protruding from a semiconductor substrate, wherein the fin includes a multi-layer stack (ML) of alternating channel layers and non-channel layers;
 forming gate spacers on sidewalls of the dummy gate stack;
 forming a recess in a source/drain (S/D) region of the ML;
 forming inner spacers on sidewalls of the non-channel layers exposed in the recess, wherein the inner spacers are embedded in the non-channel layers;
 forming an epitaxial S/D feature in the recess, such that the epitaxial S/D feature contacts the inner spacers;
 after forming the epitaxial S/D feature, removing the non-channel layers from the ML to form openings interleaved between the channel layers;
 forming a high-k metal gate stack (HKMG) in the openings and in place of the dummy gate stack; and
 removing the gate spacers after forming the HKMGs, wherein removing the gate spacers removes the inner spacers to form an air gap, such that sidewalls of the HKMG formed in the openings are exposed in the air gap.

15. The method of claim 14, wherein forming the HKMGs includes:
 forming an interlayer dielectric (ILD) layer over the epitaxial S/D feature;
 removing the dummy gate stack to form a gate trench after forming the ILD layer; and
 subsequently forming the HKMGs in the openings and in the gate trench.

16. The method of claim 15, further comprising:
 recessing a portion of the ILD layer after forming the HKMGs; and
 forming a dielectric layer over the recessed ILD layer before removing the gate spacers.

17. The method of claim 14, wherein forming the gate spacers includes forming a first spacer layer to contact the sidewalls of the dummy gate stack and forming a second spacer layer over the first spacer layer.

18. The method of claim 17, wherein removing the gate spacers includes selectively removing the first spacer layer without removing or substantially removing the second spacer layer.

19. The method of claim 17, wherein removing the gate spacers includes selectively removing the second spacer layer without removing or substantially removing the first spacer layer.

20. The method of claim 14, wherein the air gap is a first air gap, and wherein removing the gate spacers forms a second air gap, the method further comprising forming a seal layer over the HKMG, thereby partially filling the second air gap.

* * * * *